United States Patent

Quilligan

(10) Patent No.: US 7,426,372 B2
(45) Date of Patent: Sep. 16, 2008

(54) PIECEWISE LINEARIZER CIRCUIT FOR RADIO FREQUENCY AMPLIFICATION

(75) Inventor: Gerard T. Quilligan, Limerick (IE)

(73) Assignee: M/A-COM Eurotec B.V., Amsterdam (NL)

( * ) Notice: Subject to any disclaimer, the term of this patent is extended or adjusted under 35 U.S.C. 154(b) by 518 days.

(21) Appl. No.: 11/095,069

(22) Filed: Mar. 31, 2005

(65) Prior Publication Data

US 2006/0229037 A1 Oct. 12, 2006

(51) Int. Cl.
*H04B 1/04* (2006.01)

(52) U.S. Cl. .................. 455/114.3; 455/127.1; 455/102; 375/297; 341/144; 332/106

(58) Field of Classification Search ............... 455/114.3, 455/102, 127.1; 375/296, 297, 285; 341/126–192; 332/106–116
See application file for complete search history.

(56) References Cited

U.S. PATENT DOCUMENTS

| | | | | |
|---|---|---|---|---|
| 5,126,688 A * | 6/1992 | Nakanishi et al. | ............ | 330/285 |
| 5,524,286 A | 6/1996 | Chiesa et al. | ................ | 455/126 |
| 5,598,436 A | 1/1997 | Brajal et al. | ................ | 375/297 |
| 5,815,537 A * | 9/1998 | Janssen | ........................ | 375/350 |
| 5,905,760 A | 5/1999 | Schnabl et al. | ............... | 375/296 |
| 6,043,707 A | 3/2000 | Budnik | ......................... | 330/10 |
| 6,125,266 A | 9/2000 | Matero et al. | ................ | 455/126 |
| 6,147,553 A | 11/2000 | Kolanek | ........................ | 330/10 |
| 6,369,743 B2 * | 4/2002 | Ono | ............................ | 341/159 |
| 6,449,465 B1 | 9/2002 | Gailus et al. | ................. | 455/126 |
| 6,621,340 B1 | 9/2003 | Perthold et al. | .............. | 330/149 |
| 6,834,084 B2 | 12/2004 | Hietala | ......................... | 375/296 |
| 6,891,432 B2 * | 5/2005 | Nagle et al. | .................. | 330/251 |
| 6,903,619 B2 * | 6/2005 | Dennis et al. | ................ | 332/112 |
| 6,924,699 B2 * | 8/2005 | Ahmed | ......................... | 330/149 |
| 6,930,627 B1 * | 8/2005 | Hopkins | ........................ | 341/144 |
| 7,116,253 B2 * | 10/2006 | Norsworthy et al. | ........ | 341/127 |
| 7,136,003 B1 * | 11/2006 | Ripley et al. | ................ | 341/147 |
| 7,183,958 B2 * | 2/2007 | Quilligan et al. | ............ | 341/144 |
| 7,187,231 B2 * | 3/2007 | McGrath et al. | .............. | 330/51 |
| 7,242,262 B2 * | 7/2007 | Kawano | ...................... | 332/106 |
| 7,317,412 B2 * | 1/2008 | Li et al. | ........................ | 341/144 |
| 2002/0098812 A1 | 7/2002 | Sourour et al. | ................. | 455/91 |
| 2002/0180547 A1 * | 12/2002 | Staszewski et al. | ......... | 332/115 |
| 2002/0186783 A1 | 12/2002 | Opas et al. | ................... | 375/297 |
| 2002/0193085 A1 | 12/2002 | Mathe et al. | ................. | 455/126 |
| 2003/0095608 A1 | 5/2003 | Duperray | ..................... | 375/297 |
| 2003/0215025 A1 | 11/2003 | Hietala | ......................... | 375/297 |
| 2003/0215026 A1 | 11/2003 | Hietala | ......................... | 375/297 |
| 2004/0021517 A1 | 2/2004 | Irvine et al. | .................. | 330/151 |
| 2004/0047432 A1 | 3/2004 | Iwasaki | ........................ | 375/297 |
| 2004/0266366 A1 * | 12/2004 | Robinson et al. | .............. | 455/91 |
| 2005/0017801 A1 | 1/2005 | Bachman, II et al. | ........ | 330/149 |
| 2005/0122164 A1 | 6/2005 | Brandt et al. | .................. | 330/10 |
| 2005/0162294 A1 * | 7/2005 | Norsworthy et al. | ........ | 341/136 |
| 2006/0038710 A1 * | 2/2006 | Staszewski et al. | ......... | 341/143 |
| 2006/0055573 A1 * | 3/2006 | Carey et al. | .................. | 341/144 |

* cited by examiner

*Primary Examiner*—Edward Urban
*Assistant Examiner*—RuiMeng Hu

(57) ABSTRACT

An apparatus and method for amplifying a radio frequency signal including, generating a plurality of shaped pulses utilizing a piecewise linearizer circuit, applying the plurality of shaped pulses to a first input of a radio frequency amplifier circuit, and injecting a radio frequency carrier into a second input of the radio frequency amplifier circuit. The apparatus comprises a piecewise linearizer (PWL) circuit coupled to the input of a Radio Frequency Digital to Analog Converter (RF-DAC) operating as a signal amplifier.

7 Claims, 5 Drawing Sheets

PIECEWISE LINEARIZER CIRCUIT FOR RADIO FREQUENCY AMPLIFICATION

FIELD OF THE INVENTION

This present invention relates to amplifiers, and in particular, to a piecewise linearizer (PWL) circuit for use with a Radio Frequency Digital to Analog Converter (RFDAC) for providing improved amplification of radio frequency signals.

BACKGROUND OF THE INVENTION

A radiofrequency (RF) signal may be amplified by a monolithic Multiplying Digital to Analog Converter (MDAC) if a radiofrequency signal is input as a reference signal and a binary code (digital word) is utilized to control, or modulate, the amplitude of the RF output signal. Such an arrangement may be referred to as a Radio Frequency Digital to Analog Converter (RFDAC).

FIG. 1 shows a polar transmitter 100 including an RFDAC circuit 110, and a signal processor circuit 120. The RFDAC circuit 110 is controlled by a digital amplitude signal ($a^m$), and driven by a phase modulated RF carrier signal ($a^p$) generated by the signal processor circuit 120. Particularly, an input IQ base band signal (a) is first applied to a digital signal processor 10 which converts the analog IQ base band signal to digital (through Analog to Digital Converter (ADC) 11), and also transforms the signal into amplitude ($a^m$) and phase ($a^p$) components (through Rectangular to Polar Converter (RPC) 12). In particular, the ADC 11 digitizes the input analog signal (a), and the RPC 12 translates the digitized wave into polar coordinates. RPC 12 outputs a digitized wave in polar coordinates, which takes the form R, P(sin) and P(cos), for example. In this example, the R coordinate represents an amplitude characteristic ($a^m$) of the digitized input wave. The P(sin) and P(cos) coordinates represent a phase characteristic ($a^p$) of the digitized input wave.

The amplitude ($a^m$) and phase ($a^p$) characteristics are then transmitted through separate paths in the polar transmitter 100. The amplitude characteristic ($a^m$) of the digitized input wave, comprising a digital word (DW) quantized into, for example, bits $B_0$ to $B_N$, with a Most Significant Bit ("MSB") to Least Significant Bit ("LSB"), is scaled and filtered, by a digital signal processor 13, to form shaped digital pulses which are supplied to the RFDAC circuit 110. The DW may be of varying lengths in various embodiments. In general, the longer the DW the greater the accuracy of reproduction of the input analog wave (a) at the output of the RFDAC circuit 110.

In the exemplary embodiment shown in FIG. 1, the digital amplitude signal ($a^m$) is transmitted as an N-bit (e.g., 7-bit) DW through the digital signal processor 13, which scales and filters the digital bits of the DW before providing the digital bits to the RFDAC circuit 110. Each bit of the N-bit DW corresponds to a separate component control line $a_{m1-N}$ (e.g., $a_{m1-7}$) in the RFDAC circuit 110. Each of the component control lines $a_{m1-N}$ are coupled to a separate control component 22 (e.g., switching transistors $22_{a-g}$), which feeds into another transistor 25 (e.g., $25_{a-g}$), which is turned ON or OFF depending on the particular bit value on the control component line. For example, if the DW corresponding to the digital amplitude signal ($a^m$) is "1110000," the first three (3) transistors (e.g., $25_{a-c}$) will be biased ON, and the last four (4) transistors (e.g., $25_{d-g}$) will be biased OFF. In this manner, the amplification of the input analog signal (a) may be effectively controlled, as explained below.

The digital phase signal ($a^p$) is modulated onto a wave by way of Digital to Analog Converter (DAC) 18 and synthesizer 20. The synthesizer 20 preferably comprises a Voltage-Controlled Oscillator (VCO) in the exemplary embodiment. The synthesizer 20 provides an output wave ($a^p$out), which includes the phase information from the input wave (a). This output wave ($a^p$out) has a constant envelope (i.e., it has no amplitude variations, yet it has phase characteristics of the original input wave). The output wave ($a^p$out) may be further amplified by amplifier 24 before being provided to the plurality of transistors $25_{a-g}$ on respective phase signal lines $a_{p1-7}$.

Regulation of the transistors $25_{a-g}$ may be accomplished by providing the digital word (DW) to the control components (e.g., switching transistors $22_{a-g}$). Each of the control components $22_{a-g}$ preferably comprises a transistor acting as a current source. The control components $22_{a-g}$ are switched by bits of the DW generated from the digital amplitude signal ($a^m$). For example, if a bit (e.g., the bit on line $a_{m1}$) of the DW is a logic "1" (e.g., HIGH), the corresponding control component (e.g., $22_a$) is switched ON, and so current flows from that control component to respective transistor segment (e.g., $25_a$). Similarly, if the same bit (e.g., the bit on line $a_{m1}$) of the DW is a logic "0" (e.g., LOW), the corresponding control component (e.g., $22_a$) is switched OFF, and so current is prevented from flowing through that control component to respective transistor segment (e.g., $25_a$). The current from all transistor segments $25_{a-g}$ is then combined at the respective transistor outputs $26_{a-g}$, and provided as an output signal (b) on output signal line 27. Thus, by controlling the value of the DW, the amplification of the digital phase signal ($a^p$) may be accurately controlled using the digital amplitude signal ($a^m$), thereby allowing reproduction of an amplified version of the input analog signal (a) at the output of the RFDAC circuit 100.

FIG. 2 shows a conventional bias circuit 200 for biasing each of the transistor segments $25_{a-g}$ of the RFDAC circuit shown in FIG. 1. The bias circuit 200 includes a first transistor 210 ($Q_2$) with its base coupled to a reference voltage terminal $V_{ref}$, a second transistor 220 ($Q_1$) with its collector terminal also coupled to $V_{ref}$, and a third transistor 230 ($Q_0$) with its base coupled to an input radio frequency signal at $RF_{in}$. In this schematic, the third transistor 230 ($Q_0$) represents each transistor segment (e.g., transistors $25_{a-g}$) of the RFDAC (i.e., a separate bias circuit 200 would provide a bias signal to each of the transistors $25_{a-g}$ of the RFDAC circuit 100).

The bias circuit 200 provides a current at its output which is a scaled copy of the input current (i). The scale factor is determined by the geometric relationship between the second transistor 220 ($Q_1$) and output transistor 230 ($Q_0$). The input current (i) is derived from a voltage source ($V_{Con}$) driving an input resistor $R_1$. When an RF carrier is input (at input terminal $RF_{in}$) to the base terminal of the third transistor 230 ($Q_0$) through a coupling capacitor CH, an amplified RF signal appears at the output ($RF_{out}$) terminal of the bias circuit 200. The RF output signal is superimposed on a DC level determined by the input current (i) and the geometric scaling (i.e., geometry of transistors $Q_0$, $Q_1$). The output RF signal may be varied, or turned ON or OFF at will by varying the input voltage ($V_{Con}$).

A requirement of the RFDAC architecture is that the turn-ON and turn-OFF of the RF output signal occur according to a Low Pass Filter (LPF) response. A LPF disposed at the output of the RFDAC is not preferred, as it would attenuate the average RF signal. Moreover, filtering the input to the RFDAC with an LPF is possible, but is complicated by the inherent non-linearity of the Bipolar Junction Transistors (BJTs), which comprise the transistors $25_{a-g}$ of the RFDAC. The transfer function of the BJT (i.e., output current versus input voltage) is highly non-linear due to the exponential relationship between the input voltage and output current known as the 'diode equation.' Closed-loop techniques are highly effective for reducing non-linearity in circuits which are biased continuously in the ON-state, but in the transition regions from OFF-ON or ON-OFF, closed-loop dynamics can add new distortion effects due to slewing and phase margin variations.

Thus, there is presently a need for a system for effectively biasing the RFDAC such that it displays an LPF output response, but does not utilize a LPF coupled to the input or output thereof.

SUMMARY OF THE INVENTION

An exemplary embodiment of the present invention comprises a circuit including at least one radio frequency (RF) amplifier circuit, and a piecewise linearizer circuit coupled to an input of the at least one radio frequency amplifier circuit to shape pulses applied to the radio frequency amplifier circuit.

An exemplary embodiment of the present invention also comprises a method for amplifying a signal, including the steps of generating a plurality of shaped pulses utilizing a piecewise linearizer circuit, applying the plurality of shaped pulses to a first input of a radio frequency amplifier circuit, injecting a radio frequency carrier into a second input of the radio frequency amplifier circuit.

An exemplary embodiment of the present invention also comprises a circuit including a first transistor pair coupled to a first reference voltage and a first pulse signal, a second transistor pair coupled to a second reference voltage and a second pulse signal and, a third transistor pair coupled to the first and second differential transistor pairs, wherein an output pulse is provided at one of the transistors of the third transistor pair.

DETAILED DESCRIPTION

The present invention comprises, in one exemplary embodiment, a Radio Frequency Digital to Analog Converter (RFDAC) system including a Piecewise Linearizer (PWL) for shaping pulses applied to an input terminal of the RFDAC.

Time domain pulses can be generated with arbitrary edge shapes using different approaches. One approach is to synthesize the edges using piecewise linear (PWL) segments generated by differential Metal Oxide Semiconductor (MOS) transistor pairs driven by differently delayed pulses with different widths and different amplitudes. The resulting time domain output signal can then be made to exhibit spectral responses similar to other circuit functions such as Low Pass Filters (LPFs), and other known functions. For example, an LPF time domain response exhibits approximate 'S' shaped rising and falling edges, arising from the attenuation of frequency components higher than the filter 3 dB point. A PWL circuit output can be made to follow approximately the same wave shape (e.g., 'S' shape) and exhibit a similar spectral response. The need for such an approach arises from the requirement to shape some circuit outputs (e.g., the output of an RFDAC) to approximate a LPF response, or other responses.

Figure 1:
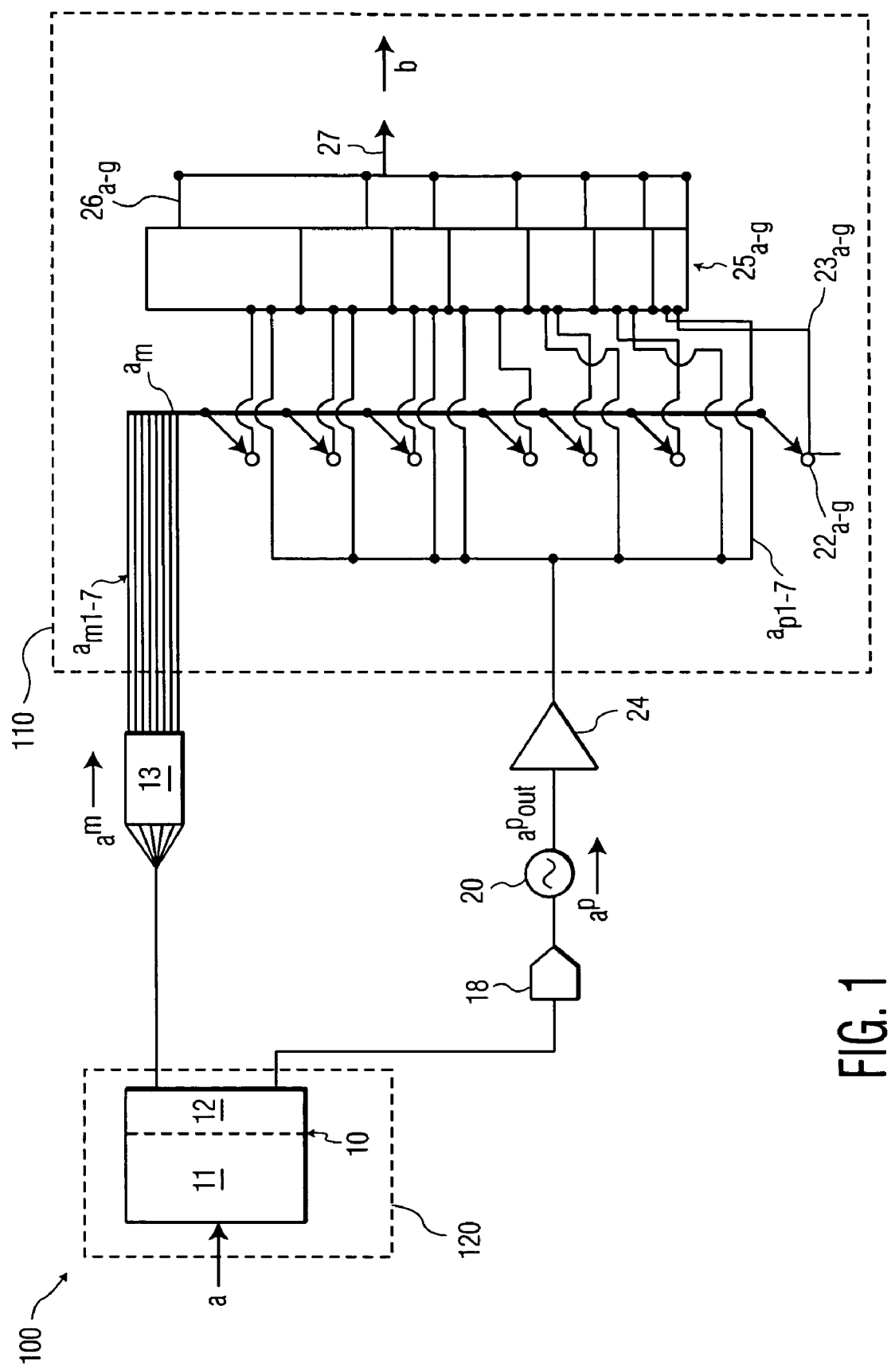
FIG. 1 shows a conventional RFDAC circuit.
Figure 2:
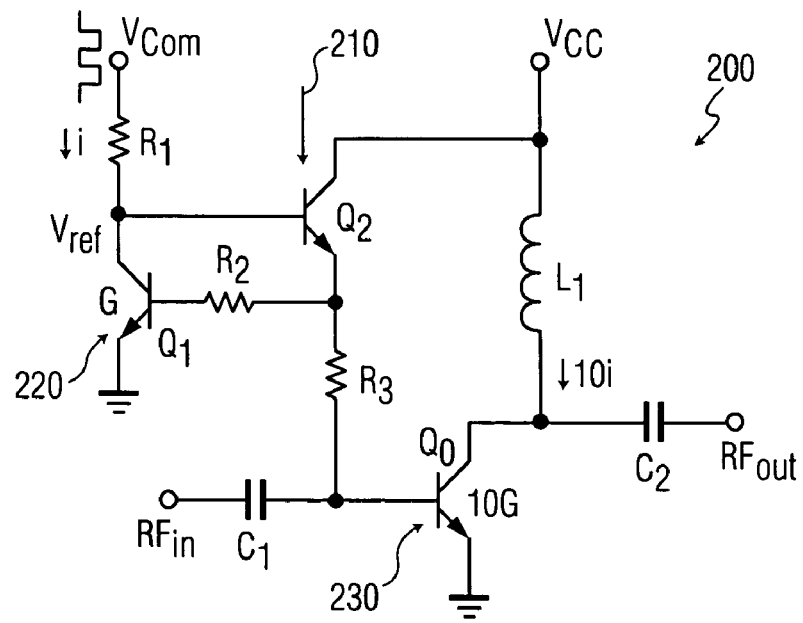
FIG. 2 shows a conventional bias circuit.

PWL segments are particularly useful with the RFDAC (See FIG. 1). For example, a PWL circuit can compensate somewhat for the non-linearity in the transition regions (e.g., ON-OFF, OFF-ON) by generating a response which incorporates an inverse of the transition regions with the desired output ('S' shaped) response. Additional PWL segments can be added which generate the inverse of the non-linear regions.

Figure 3:
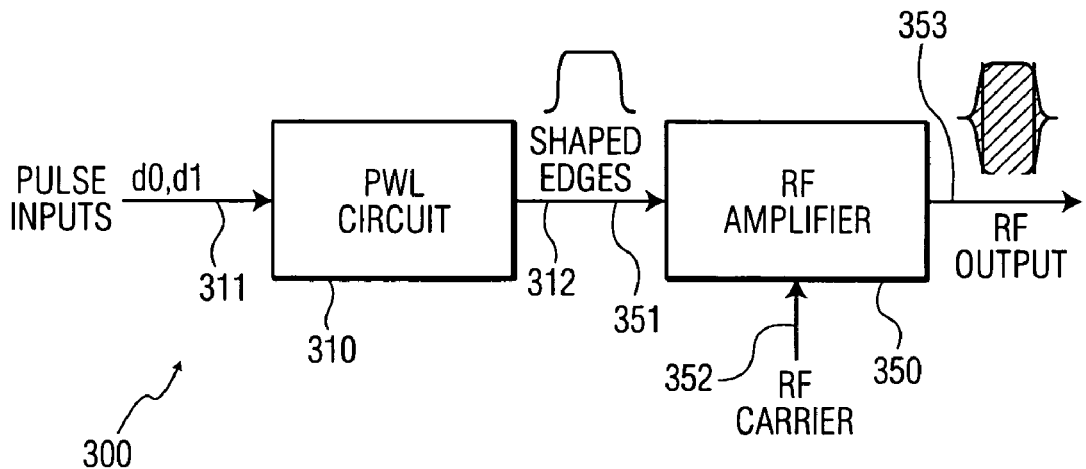
FIG. 3 shows a block diagram of radio frequency amplification system according to an exemplary embodiment of the present invention.

FIG. 3 is a block diagram showing a radio frequency (RF) amplification system 300 according to an exemplary embodiment of the present invention. The system 300 includes a PWL circuit 310 disposed upstream from one bit segment of the conventional RFDAC 350. The PWL circuit 310 includes a first input 311 for receiving a signal comprising a plurality of pulses (e.g., square wave pulses). The PWL circuit 310 processes the plurality of pulses to provide a single pulse with shaped edges at an output 312. The RFDAC bit segment 350 includes a first input 351 for receiving the shaped pulses generated by the PWL circuit 310, and a second input 352 for receiving an RF carrier signal. An amplified RF signal (shaped according to the shaping edge pulses) is provided at an output 353 of the RFDAC bit segment 350. In a complete RFDAC system, there would be as many PWL circuits 310 as RFDAC bit segments 350. For example, in a 7-bit binary weighted RFDAC, there would be seven (7) PWL circuits 310 driving the seven (7) individual RFDAC bit segments 350.

Pulse inputs to the PWL circuit 310 result in a PWL approximation of the desired edge shape which is then input to the RFDAC bit segment 350. The shape is determined by the timing of the pulses, and thus, there can be as many pulses as needed to obtain the required shape.

Figure 4:
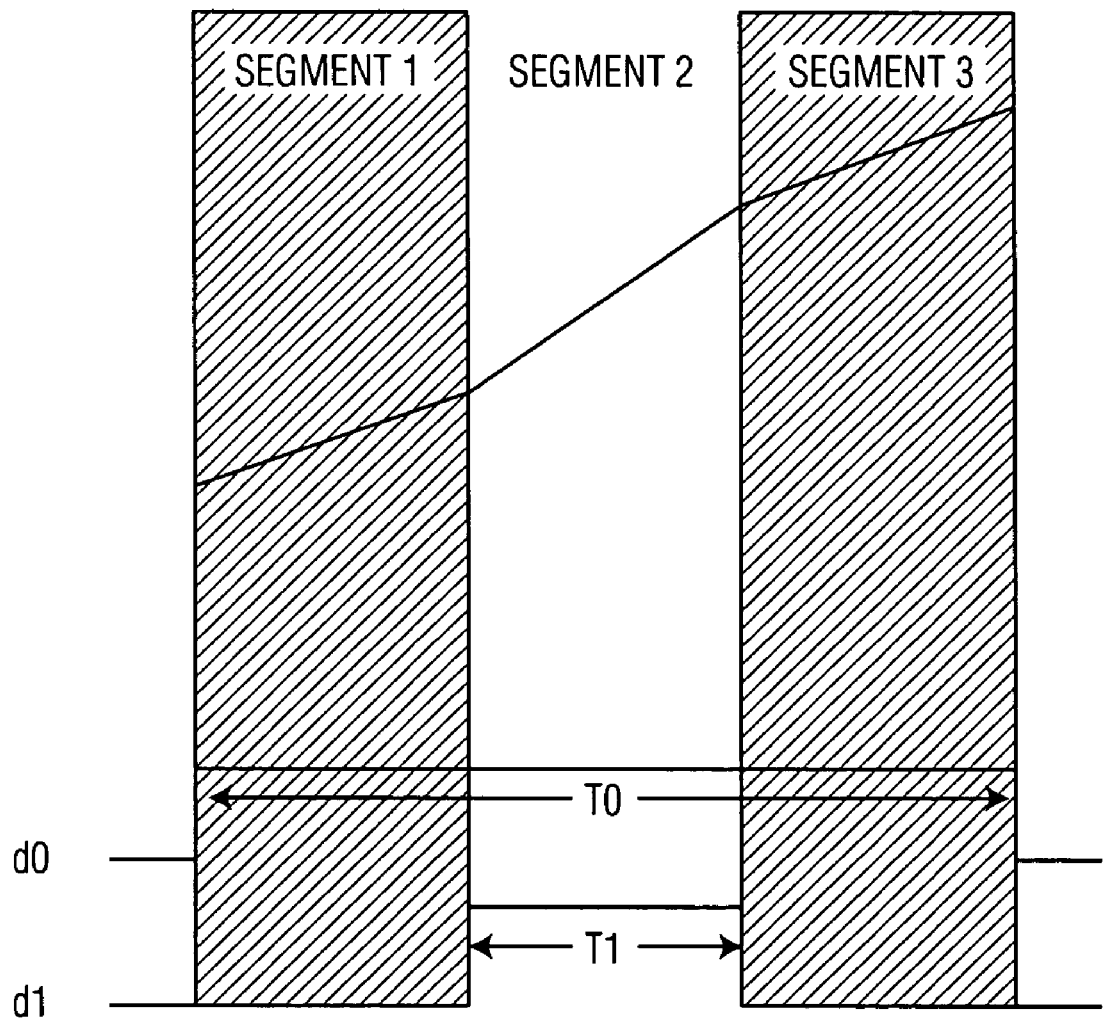
FIG. 4 shows a graph of an exemplary pulse shape for the transition regions of the pulses generated by a piecewise linearizer circuit.

FIG. 4 shows a graph of an exemplary rising edge shape for the transition regions of the pulses generated by the PWL circuit 310. As will be noted, the shape of the transition regions is roughly that of an 'S', characterized by three (3) piecewise linear regions (e.g., Segment 1, Segment 2, Segment 3). Segment 1 is a 'low' gain segment, Segment 2 is a 'high' gain segment, and Segment 3 is another 'low' gain segment. 'Low' and 'high' gains, in the context of the PWL circuit, refer to the rates of change of the output voltage versus time.

FIG. 4 also shows two exemplary pulse signals (e.g., d0, d1) which may be used to achieve the desired output 'S' pulse shape. In particular, pulse signals d0 and d1 would be applied to the first input port 311 of the PWL circuit 310 in order to achieve the 'S' shaped pulse at the output port 312 of the PWL circuit.

It will be noted that pulse signals d0 and d1 each represent an interval corresponding to a particular gain. For example, if d0 pulses 'high' while d1 stays 'low' (or vice versa), then the output of the PWL circuit 310 slews at a rate of 'G' Volts/second (v/s). However, if d0 and d1 both pulse 'high' simultaneously, the output of the PWL circuit 310 slews with a rate of 2*G v/s for the interval that they are both 'high.' In order to achieve an 'S' shaped curve as shown in FIG. 4, d0 is pulsed 'high' with an interval T0, then d1 is pulsed 'high' with an interval T1, where T1 is less than T0, but delayed with respect to T0. It will be noted by those of ordinary skill in the art that FIG. 4 shows only the rising edge of a pulse generated by PWL circuit 310, but the above description applies equally as well to the falling edge of the pulse.

Figure 5:
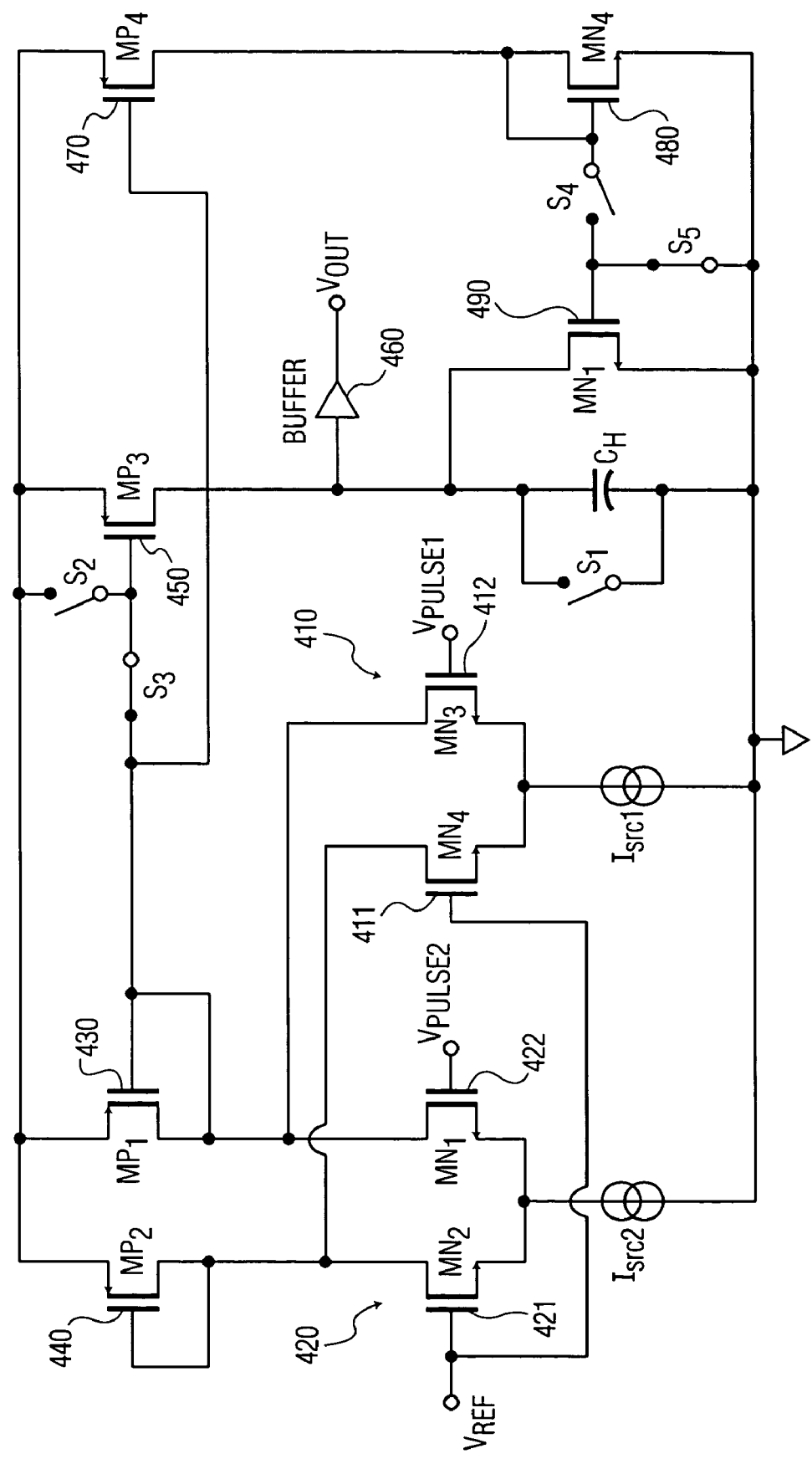
FIG. 5 shows a schematic of a pulse-shaping circuit for generating a rising and falling edge shape according to an exemplary embodiment of the present invention.

FIG. 5 shows a schematic of a pulse-shaping circuit 400 according to an exemplary embodiment of the present invention. The pulse-shaping circuit 400 may be used for shaping the rising and falling edges of an output pulse. The pulse-shaping circuit 400 includes two (2) N-Type Metal Oxide Semiconductor (NMOS) differential transistor pairs 410, 420 (including transistors 411-412, 421-422), each pair having a common drain connection. The common drains of the NMOS differential transistor pairs 410, 420 are loaded by first and second diode-connected P-Type Channel Metal Oxide Semiconductor (PMOS) transistors 430, 440. In general, there can be an arbitrary number of NMOS differential pairs, depending on the required number of segments in the shaped edges, but in practice one would use only the minimum required to implement the desired shape.

The NMOS differential transistor pairs 410, 420 are biased by first and second current sources, $I_{src1}$ and $I_{src2}$, respectively. The current sources $I_{src1}$ and $I_{src2}$ may supply various current values, and alteration thereof permits varied pulse shapes for the output pulse (present at the output terminal $V_{out}$). For example, if the current sources $I_{src1}$, $I_{src2}$ supply the same current value, then the maximum current controlled through differential pairs 410, 420 is twice $I_{src1}$ or $I_{src2}$. The width to length (W/L) ratios of the NMOS transistors 411, 412, 421, 422 may, in general, be equal. Preferably, the W/L ratios of the NMOS transistors are consistent with their bias currents, and the available supply voltage.

The NMOS differential transistor pairs 410, 420 also include first and second pulse input terminals ($V_{pulse1}$, $V_{pulse2}$), and a common reference voltage terminal ($V_{ref}$). The first and second pulse input terminals ($V_{pulse1}$, $V_{pulse2}$), along with the relative values of the first and second current sources ($I_{src1}$, $I_{src2}$) directly affect the resulting pulse shape, by changing the rate of charging and discharging of capacitor $C_H$.

As with the PWL circuit 310 discussed above, pulse signals (e.g., d0, d1) are provided at the first and second pulse input terminals (e.g. $V_{pulse1}$, $V_{pulse2}$) to produce a shaped pulse (e.g., 'S' shaped) at the output of the pulse-shaping circuit 400 (i.e., at output terminal $V_{out}$). The reference voltage terminal ($V_{ref}$) is used to define a threshold voltage above which $V_{pulse1}$ and $V_{pulse2}$ must rise to drive the current through the respective differential transistor, as discussed below.

The pulse-shaping circuit 400 includes a first output PMOS transistor 450 coupled to the gate and drain terminals of the first PMOS transistor 430 by a first switch $S_3$. The first switch $S_3$ allows for decoupling of the first output PMOS transistor 450 from the NMOS differential transistor pairs 410, 420, and the drain-gate of the first PMOS transistor 430 of the pulse-shaping circuit 400. A current mirror PMOS transistor 470 is also directly coupled to the gate terminal of the first PMOS transistor 430.

The drain of the current mirror PMOS transistor 470 couples directly to the drain and gate of a first output NMOS transistor 480, and to the gate of a second output NMOS transistor 490 through a second switch $S_4$. The second switch $S_4$ allows for decoupling of the second output NMOS transistor 490 from the first output NMOS transistor 480 and the first output PMOS transistor 470. Third and fourth switches $S_2$ and $S_5$ allow transistors 450 and 490 to be turned OFF so as to prevent charging or discharging of capacitor $C_H$. A buffer 460 isolates the top plate of the capacitor $C_H$ from the load (not shown) to prevent inadvertent charging or discharging by the load and/or parasitic resistances, and provides the shaped pulse signal to an output terminal of the pulse-shaping circuit 400. Fifth switch $S_1$ allows the discharging of the capacitor $C_H$.

First through fifth switches $S_1$-$S_5$ determine whether the pulse-shaping circuit 400 is in 'rising', 'hold', 'falling' or 'reset' mode. A complete sequence generating a shaped output pulse comprises 'reset', 'rise,' 'hold' and 'fall' modes, in that order. When switches $S_1$, $S_2$ and $S_5$ are closed, and switches $S_3$ and $S_4$ are open, devices 450 and 490 are OFF (i.e. are not conducting current in the transistors' saturated regions), while devices 470 and 480 are ON (i.e. are conducting current in the transistors' saturated regions), and the top plate of capacitor $C_H$ is completely discharged in 'reset' mode. When switches $S_3$ and $S_5$ are closed, and switches $S_1$, S2, and $S_4$ are open, devices 450, 470 and 480 are ON, with device 490 OFF, and thus the voltage on the top plate of capacitor $C_H$ is increasing in 'rise' mode. When switches $S_1$, $S_3$ and $S_4$ are open, and switches $S_2$ and $S_5$ are closed, devices 470 and 480 are ON, while devices 450 and 490 are OFF, and thus the voltage on the top plate of $C_H$ is held at a constant level in a 'hold' mode. When switches $S_1$, $S_3$ and $S_5$ are open, and switches $S_2$ and $S_4$ are closed, transistor 450 is OFF, while devices 470, 480 and 490 are ON, thus the voltage on the top plate of $C_H$ is decreasing in 'fall' mode. It will be noted that that transistors 450 and 470 provide mirroring of current from transistor 430, since all three devices have equal gate-to-source voltages when ON.

In operation, current is generated in the PMOS transistors 430, 440 by the NMOS differential transistor pairs 410, 420 and the pulses (e.g., $V_{pulse1}$, $V_{pulse2}$) and voltage reference signal (e.g., $V_{ref}$) applied thereto. Specifically, the current flowing in PMOS transistor 430 is 'mirrored' in the output transistor 450. In particular, the current flowing in output transistor 450 equals a scaled version of the total current in PMOS transistor 430, as determined by the relative values of width/length (W/L) in the output PMOS transistor 450 and the PMOS transistor 430. Prior to application of the pulse signals d0, d1 (e.g., $V_{pulse1}$, $V_{pulse2}$), the capacitor $C_H$ is discharged by closing switches $S_1$, $S_2$ and $S_5$ and opening switches $S_3$-$S_4$. When operating in shaping mode, switches $S_1$ and $S_2$ are first opened and switch $S_3$ is then closed, so that the mirrored current in the output PMOS transistor 450 is used to charge the capacitor $C_H$. The voltage on the top plate of capacitor $C_H$ will rise at a rate determined by the values of pulse signals d0 and d1 throughout the charging interval $T_0$. When the edge shaping interval is ended, switch $S_3$ is opened and the charge is held on the capacitor $C_H$.

Preferably, PMOS transistors 430, 440 have equal W/L ratios. However, the W/L ratio of the output transistor 450 may be increased or decreased to set the desired amplitude of the shaped output pulse. For example, the W/L ratio of the output transistor 450 may be equal to the W/L ratio of the PMOS transistors 430, 440 multiplied by two.

As stated above, current flows into the capacitor $C_H$ when the third and fifth switches $S_2$, $S_1$ are open with $S_3$ closed, which occurs at the beginning of an edge shaping interval (e.g., a rising edge interval). The current in the capacitor $C_H$ charges the capacitor at a rate determined by the value of the current and the capacitance of capacitor $C_H$. Switching ON and OFF of the currents in NMOS transistors 412, 422 (through the application of voltage at terminals $V_{pulse1}$, $V_{pulse2}$) determines the charging rate. The buffer 460 isolates $C_H$ from the output load (not shown) with a high input impedance and low output impedance.

The input pulses applied to the NMOS differential transistor pairs 410, 420 (e.g., the pulses applied at first and second pulse terminals $V_{pulse1}$, $V_{pulse2}$) determine when the currents in the NMOS differential transistor pairs 410, 420 are shunted into PMOS transistors 430, 440. Those of ordinary skill in the art will realize that the pulses applied at the first and second pulse terminals $V_{pulse1}$, $V_{pulse2}$ may have a shape similar to pulses d0 and d1 in FIG. 3 discussed above.

When a pulse applied at either of the first and second pulse terminals $V_{pulse1}$, $V_{pulse2}$ is higher than the reference voltage $V_{ref}$ by a minimum value, all of the corresponding current in the respective current source (e.g., $I_{src1}$, $I_{src2}$) is shunted into PMOS transistor 430, and correspondingly 'mirrored' in output transistor 450 and current source PMOS transistor 470. At the end of a particular edge shaping interval (e.g., rising edge interval), output PMOS transistor 450 is isolated by opening first switch $S_3$, and turned OFF by closing third switch $S_2$. This switching action shuts OFF the current to $C_H$, and the voltage on $C_H$ at that instant is held.

In the pulse-shaping circuit 400, PMOS transistor 470, and NMOS transistors 480, 490 change the direction of the current flow in capacitor $C_H$ from into the top plate to out of the top plate, effectively allowing for a discharge of the capacitor $C_H$. Switches $S_4$, $S_5$ function similarly to first and third switches $S_2$, $S_3$ in the pulse-shaping circuit 400, in that they isolate the discharging current from the capacitor $C_H$ during the 'rising' and 'reset' intervals.

Figure 6:
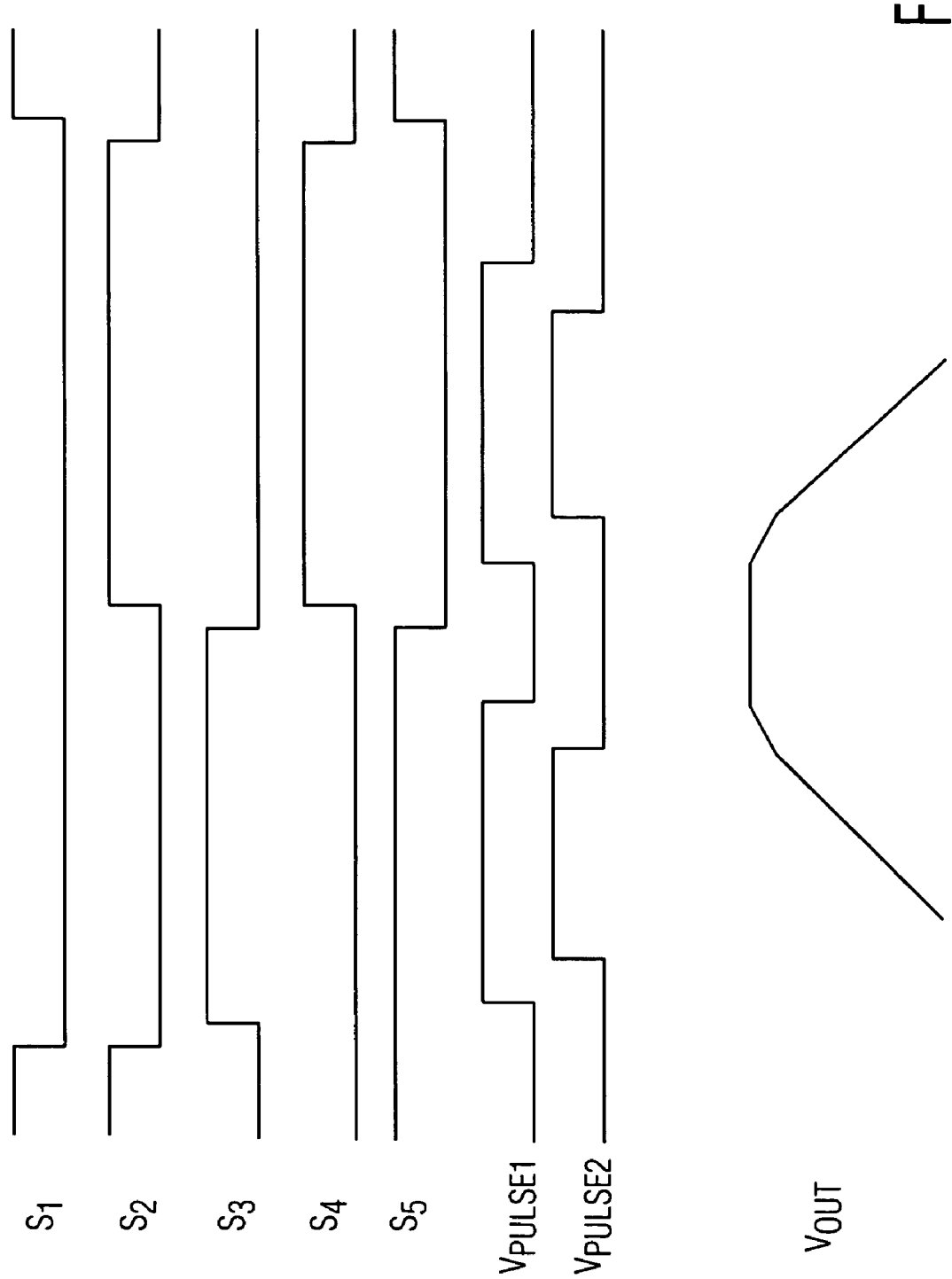
FIG. 6 shows a timing diagram for the exemplary pulse-shaping circuit shown in FIG. 5.

FIG. 6 shows an exemplary timing diagram of the pulses which are supplied to the pulse-shaping circuit 400 by a timing circuit (not shown), which is programmed to give the correct shape to the output edges. The signals $S_1$-$S_5$ shown in FIG. 6 correspond to the signals applied to switches $S_1$-$S_5$ shown in FIG. 5. When a signal shown in FIG. 6 is at a low level, the corresponding switch ($S_1$-$S_5$) is OFF, presenting a high impedance between its terminals. When a signal shown in FIG. 6 is at a high level, the corresponding switch ($S_1$-$S_5$) is ON, presenting a low impedance between its terminals. The control pulses presented to first and second pulse input terminals ($V_{pulse1}$, $V_{pulse2}$) are shown in FIG. 6 as $V_{pulse1}$ and $V_{pulse2}$, which may be at low or high levels. Both the delay and duration of these pulses determine how fast the output node ($V_{out}$) rises and falls. The reference voltage input to the pulse-shaping circuit 400 is connected to input terminal $V_{ref}$.

Generation of a shaped pulse using the pulse-shaping circuit 400 in FIG. 5 would occur as follows: initially, the charge on capacitor $C_H$ is set to zero (0) by opening switches $S_3$-$S_4$ and closing switches $S_1$-$S_2$, $S_5$. Hence the voltage on the top plate of capacitor $C_H$, and thus the voltage on the output terminal $V_{out}$, are all zero (0). All of the positive input pulse voltages (e.g., $V_{Pulse1}$, $V_{Pulse2}$) are also initially at zero (0) Volts. The rising edge is shaped first, followed by the falling edge. For the rising edge case, switches $S_1$-$S_2$, and $S_4$ are opened, then switches $S_3$, $S_5$ are closed. Thus, PMOS transistor device 450 may charge capacitor $C_H$, and NMOS transistor 490 is OFF. Upon application of voltage pulses at any or all positive input pulse terminals ($V_{pulse1}$, $V_{pulse2}$), which exceed the reference voltage (e.g., $V_{ref}$) by several hundred tenths of a Volt, the current in PMOS transistor device 430 increases in proportion to the number of differential transistor pairs (e.g., 411-412 and 421-422) which have current shunted through the devices connected to the positive inputs ($V_{pulse1}$, $V_{pulse2}$). Since PMOS transistor device 430 is diode connected, and its gate is connected to the gate of PMOS transistor device 450, the current in 450 is a scaled version of the current in 430, determined by the ratio of the W/L of 450 to that of 430.

The drain current of PMOS transistor device 450 then charges capacitor $C_H$ at a rate determined by the number of differential transistor pairs which are shunting their currents into 430. This rate is ultimately determined by the timing of the pulses applied to the positive inputs $V_{pulse1}$, $V_{pulse2}$ and the value of the current. At the end of the rising edge interval, switch $S_3$ is opened and $S_2$ is closed (turning OFF 450), and, as long as all other switches are kept in the same state as at the beginning of and throughout the rising interval, the voltage on the top plate of capacitor $C_H$ is held at the value existing at the instant $S_3$ is opened. Capacitor $C_H$ should have a value large enough to prevent excessive droop (from leakage and/or parasitic resistances) during the hold interval.

Then, for the falling edge, switch $S_4$ is closed after $S_5$ is opened after the pulses on the positive inputs $V_{pulse1}$-$V_{pulse2}$ are reset to zero (0). Now, PMOS transistor device 470 acts as a 'current mirror' with its gate-source voltage determined by the gate-source voltage of 430. The current from 470 flows into NMOS transistor 480, and is again mirrored into NMOS transistor 490. NMOS transistor 490 acts as a 'current sink' removing charge from the top plate of capacitor $C_H$ at a rate determined by the pulse values appearing on inputs $V_{pulse1}$, $V_{pulse2}$.

The above-referenced timing circuit supplies a set of pulses during the falling interval which have the same effect on the differential transistor pairs as described above for the rising interval, except that the capacitor $C_H$ is discharged during the falling interval. At the end of the discharge interval, switch $S_4$ is opened and switch $S_5$ is closed, thus turning NMOS transistor 490 OFF. Whatever charge is remaining on $C_H$ prior to this instant is held until the above described reset sequence is re-applied.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention. For example, improved current mirroring may be achieved by cascoding of the current mirrors and/or employing negative feedback around them.

What is claimed is:

1. A circuit comprising: at least one radio frequency amplifier circuit; and, a piecewise linearizer circuit coupled to an input of the at least one radio frequency amplifier circuit to shape pulses applied to the radio frequency amplifier circuit, the piecewise linearizer circuit comprising a first transistor pair coupled to a reference voltage and a first pulse signal, a second transistor pair coupled to the reference voltage and a second pulse signal, a third transistor pair with each drain terminal of the third transistor pair coupled to corresponding drain terminals of each of the first and second transistor pairs, and an output transistor with its gate terminal coupled to the gate terminal of at least one of the transistors of the third transistor pair.

2. The circuit of claim 1, wherein the piecewise linearizer circuit further comprises:
   a first switch coupled between the gate terminal of the output transistor and the gate terminal of the at least one transistor of the third transistor pair.

3. The circuit of claim 2, wherein the piecewise linearizer circuit further comprises:
   a second switch coupled between the gate and the source terminals of the output transistor; and,
   a third switch coupled across a first capacitor, said capacitor coupled to the drain terminal of the output transistor.

4. The circuit of claim 2, further comprising a first transistor with its gate and drain terminals coupled to the first capacitor.

5. The circuit of claim 4, further comprising a fourth switch coupled to the source terminal of the first transistor.

6. The circuit of claim 5, further comprising a fifth switch coupled to the source terminal of the first transistor.

7. A method for amplifying a signal, comprising the steps of: generating a plurality of shaped pulses utilizing a piecewise linearizer circuit and applying a first pulse signal and a reference voltage to a first transistor pair, applying a second pulse signal and the reference voltage to a second transistor pair, generating a current in a first transistor of a third transistor pair, and applying the current from the first transistor of the third transistor pair to an output transistor with its gate terminal coupled to the gate terminal of at least one of the transistors of the third transistor pair, the third transistor pair having each drain terminal of the third transistor pair coupled to corresponding drain terminals of each of the first and second transistor pairs; applying the plurality of shaped pulses to a first input of a radio frequency amplifier circuit; and injecting a radio frequency carrier into a second input of the radio frequency amplifier circuit.

\* \* \* \* \*